US006303263B1

(12) United States Patent
Chen et al.

(10) Patent No.: US 6,303,263 B1
(45) Date of Patent: *Oct. 16, 2001

(54) IRRADIATION SENSITIVE POSITIVE-TONE RESISTS USING POLYMERS CONTAINING TWO ACID SENSITIVE PROTECTING GROUPS

(75) Inventors: Kuang-Jung Chen; Ronald A. DellaGuardia; Wu-Song Huang; Ahmad D. Katnani; Mahmoud M. Khojasteh, all of Poughkeepsie; Qinghuang Lin, Wappingers Falls, all of NY (US)

(73) Assignee: International Business Machines Machines, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,568

(22) Filed: Feb. 25, 1998

(51) Int. Cl.[7] .................................................. G03F 7/039
(52) U.S. Cl. ................ 430/270.1; 430/905; 430/907; 430/909; 430/910
(58) Field of Search ................ 430/270.1, 905, 430/910, 907, 909

(56) References Cited

U.S. PATENT DOCUMENTS

| | | | |
|---|---|---|---|
| 4,491,628 | 1/1985 | Ito et al. ........................ | 430/176 |
| 5,210,000 | 5/1993 | Thackeray et al. ................ | 430/165 |
| 5,252,435 | 10/1993 | Tani et al. ........................ | 430/325 |
| 5,258,257 | 11/1993 | Sinta et al. ........................ | 430/192 |
| 5,352,564 | * 10/1994 | Takeda et al. .................... | 430/270.1 |
| 5,372,912 | 12/1994 | Allen et al. ....................... | 430/270.1 |
| 5,558,976 | * 9/1996 | Urano et al. ...................... | 430/326 |
| 5,585,220 | 12/1996 | Breyta et al. ..................... | 430/270.1 |
| 5,609,989 | 3/1997 | Bantu et al. ...................... | 430/270.1 |
| 5,627,006 | * 5/1997 | Urano et al. ...................... | 430/192 |
| 5,736,296 | * 4/1998 | Sato et al. ........................ | 430/270.1 |
| 6,013,411 | * 1/2000 | Aoai et al. ....................... | 430/270.1 |
| 6,037,097 | * 3/2000 | Bucchignano et al. ........... | 430/270.1 |

FOREIGN PATENT DOCUMENTS

| | | |
|---|---|---|
| 0 679 951 A1 | 11/1995 | (EP) . |
| 0 701 171 A1 | 3/1996 | (EP) . |
| 0 788 031 A1 | 8/1997 | (EP) . |

OTHER PUBLICATIONS

Hattori et al., "Dissolution Inhibition of Phenolic Resins by Diazonaphthoquinone: Effect of Polymer Structure," Jpn. J. Appl. Phys. Part 1, vol. 30, No. 11B, pp. 3125–3131 (Nov. 1991).

127:115290C "Chemically amplification–type positive working resist composition" Photoresist News, Oct. 1996, vol. 55.

* cited by examiner

*Primary Examiner*—John S. Chu
(74) *Attorney, Agent, or Firm*—Scully, Scott, Murphy & Presser; Steven Capella, Esq.

(57) ABSTRACT

The present invention is directed to a high-performance irradiation sensitive resists and to a polymer resin composition useful for making the same. In accordance to the present invention, the polymer resin comprises a dual blocked polymer resins. Specifically, the dual blocked polymer resin comprises at least two different acid labile protecting groups which block some, but not all, of the polar functional groups of the polymer resin. a chemically amplified resist system comprising said dual blocked polymer resin; at least one acid generator; and a solvent is also provided herein.

24 Claims, No Drawings

IRRADIATION SENSITIVE POSITIVE-TONE RESISTS USING POLYMERS CONTAINING TWO ACID SENSITIVE PROTECTING GROUPS

FIELD OF THE INVENTION

The present invention relates to semiconductor manufacturing and, in particular, to a high-performance irradiation sensitive positive-tone resist for use in mid-ultraviolet (UV), deep-UV, extreme-UV, X-ray and e-beam lithography. In one aspect of the present invention, the positive-tone resist comprises an aqueous base soluble polymer resin wherein the polar functional groups of the polymer resin are blocked, i.e. protected, with at least two different acid labile protecting groups. Such a polymer composition is referred to herein as a "dual blocked polymer resin" since the polymer resin contains at least two different protecting groups. The present invention also provides a chemically amplified resist system comprising the dual blocked polymer resin of the present invention.

BACKGROUND OF THE INVENTION

In the field of semiconductor manufacturing, optical lithography has been the main stream approach to pattern semiconductor devices. In typical prior art lithography processes, UV light is projected onto a silicon wafer coated with a thin layer of photosensitive resist through a mask that defines a particular circuitry pattern. Exposure to UV light, followed by subsequent baking, induces a photochemical reaction which changes the solubility of the exposed regions of the photosensitive resist. Thereafter, an appropriate developer, usually an aqueous base solution, is used to selectively remove the resist either in the exposed regions (positive-tone resists) or, in the unexposed region (negative-tone resists). The pattern thus defined is then imprinted on the silicon wafer by etching away the regions that are not protected by the resist with a dry or wet etch process.

Many of the currently used resists are chemically amplified positive-tone resists which are made of two major components: The first component of such chemically amplified resists is an aqueous base soluble polymer where the polar functional groups are protected by acid labile protecting (or so-called blocking) groups. The presence of such protecting groups converts the aqueous base soluble polymer into an insoluble resin. Acid catalyzed deprotection of the protected sites converts the polymer back into an aqueous base soluble polymer.

The second major component of prior art chemically amplified positive-tone resists is a photoacid generator. Exposure of these resists to UV irradiation typically generates an acidic catalytic species as a result of the photochemistry of the acid precursor. The catalytic species are believed to induce a cascade of subsequent chemical transformations of the resist that alter the solubility of the exposed regions. Thus, the quantum efficiency of the photochemical event is amplified hundreds or even thousands of times through the catalytic chain reaction. The most commonly employed chemical amplification involves the acid catalyzed deprotection of various partially protected poly(p-hydroxystyrene), poly(acrylic acid), or copolymers thereof for positive-tone resists. The chemical amplification of resist materials are described in detail in U.S. Pat. No. 4,491,628 to Ito; U.S. Pat. No. 5,252,435 to Tani, et al.; U.S. Pat. No. 5,258,257 to Sinta, et al.; U.S. Pat. No. 5,352,564 to Takeda, et al.; U.S. Pat. No. 5,210,000 to Thackeray, et al.; and U.S. Pat. No. 5,585,220 to Breyta.

The acid labile protecting groups used with the aqueous base soluble polymer resins can be classified into two distinct groups: (I) High activation energy protecting groups such as t-butyl ester or t-butyl carbonyl groups; and (II) Low activation energy protecting groups such as acetal, ketal or silylether groups.

Resists containing polymer resins protected with high activation energy protecting groups generally require a post-exposure baking step to effect the deprotection and solubility switch due to the high bonding energy. In the case of resists containing low activation energy protecting groups, a post-exposure baking step is not necessarily required because of the facile deprotection chemistry of this group which generally occurs at about room temperature.

Accordingly, each of the foregoing acid labile protecting groups has their own advantages and disadvantages associated therewith. For example, the high activation energy protecting groups tend to give rise to high resolution, but suffer from environmental contamination during the post-exposure delay. On the other hand, the low activation energy protecting groups tend to exhibit robust environmental stability, however they normally suffer from line width slimming and shelf-life problems.

In view of the state of prior art resists, it would be beneficial if a new resist could be formulated which incorporates the advantages of both types of protecting groups in a single resist while eliminating the disadvantages associated with each protecting group. That is, there is a continued need to develop a new and improved resist which exhibits high resolution upon exposure to UV irradiation, good environmental stability and that could be used to pattern semiconductor circuitries.

SUMMARY OF THE INVENTION

One object of the present invention is provide a simple, yet highly manufacturable method of formulating high performance positive-tone resists that combine all of the best features and/or properties of each of the above-mentioned protecting groups into a single resist.

Another object of the present invention is to provide a method of formulating a positive-tone resist that exhibits high resolution and good environmental stability.

A further object of the present invention is to provide a positive-tone resist system that can be used in semiconductor manufacturing, and, in particular, in the patterning of semiconductor circuitries.

These and other objects and advantages are achieved in the present invention by providing an aqueous base soluble polymer resin having polar functional groups thereon wherein some, but not all, of said polar functional groups are blocked with at least two different protecting groups. These so-called "dual blocked polymers" may contain either low activation energy protecting groups, high activation energy protecting groups, or mixtures thereof with the proviso that it contains at least two different protecting groups.

A further aspect of the present invention is directed to a positive-tone chemically amplified resist system which comprises (a) the polymer resin of the present invention, i.e. dual blocked polymer; (b) an acid generator; (c) a solvent for said polymer resin; and, optionally, (d) a photosensitizer that is capable of absorbing irradiation in the mid-UV, deep-UV, extreme-UV, X-ray or e-beam range. The chemically amplified resist system of the present invention may further comprise (e) a base for said dual blocked polymer and/or (f) a surfactant.

DETAILED DESCRIPTION OF THE INVENTION

As stated above, the present invention provides a dual protected polymer resin which comprises an aqueous base soluble polymer resin having polar functional groups thereon, wherein some, but not, all of said polar functional groups are protected with at least two different acid labile protecting groups.

The aqueous base soluble polymer resins employed in the present are typically well known to those skilled in the resist material art. Generally, the aqueous base soluble polymer resins employed in the present invention are homopolymers containing one monomeric repeating unit or higher polymers, i.e. copolymers, terpolymers, etc., containing two or more monomeric repeating units that are soluble in an alkaline solution. Moreover, the aqueous soluble base polymer resins employed in the present invention are those that contain polar functional groups that readily ionize. The polar functional groups of the polymer resins are generally hydroxyl or carboxyl functionalities.

Illustrative examples of suitable homopolymers that can be utilized in the present invention include, but are not limited to: phenolic-containing resins such as poly(hydroxystyrene) including the para-, meta-, and ortho-substituted forms and phenol formaldehydes; polymers having an acid or an anhydride group, e.g. polyacrylic acid or polymethacrylic acid; or acrylamide, imide or hydroxyimide group type polymers.

Preferred homopolymers have an average molecular weight within the range of 1000 to 250,000, and preferably within the range of 2000 to 25,000. A highly preferred homopolymer that can be employed as the polymer resin is poly(hydroxystyrene) (PHS), with the para-form being the most preferred.

Examples of suitable higher polymer resins that can be employed in the present invention are those which contain at least two of the following monomers: hydroxystyrenes, styrenes, acrylic acid, methacrylic acid, acrylates, vinylcyclohexanol, phenol formaldehydes, methacrylates, acrylamides, maleic anhydrides and maleimides. The higher polymer resins employed in the present invention have the same molecular weight as expressed for the homopolymers. A highly preferred higher polymer employed in the present invention is one which contains at least two of the following monomeric units: hydroxystyrene, styrene, acrylic acid, vinylcyclohexanol, acrylate, methacrylic acid and methacrylate.

The aqueous base soluble polymer resins employed in the present invention also contain a polymeric backbone such as, but limited to: polyolefins, polyolefin sulfones, polysulfones, polyketones, polycyclic olefins, polycarbonates, polyimides, polyethers and the like. A highly preferred polymeric backbone for the aqueous base soluble polymer resins is polyethylene.

The aqueous base soluble polymer resins employed in the present invention are prepared using conventional techniques that are well known to those skilled in the art. These include liquid or gas phase polymerizations or copolymerizations using cationic, anionic or free- radical catalysts or Ziegler-Natta catalysts.

In accordance with the present invention, some, but not all, of the polar functional groups of the aqueous soluble polymer resin are modified, i.e. protected, with at least two different acid labile protecting groups. Suitable acid labile protecting groups include: high activation energy protecting groups, low activation energy protecting groups, or mixtures thereof. It is emphasized that the present invention contemplates the use of protecting groups from the same class as along as the protecting groups are substantially different. Thus, it is within the scope of the present invention to use only high activation energy protecting groups or low activation energy protecting groups. It is, however, preferred that the polar functional groups of the aqueous base soluble polymer resin be protected with a high activation energy protecting group and a low activation energy group.

The protecting groups, which are also called acid labile protecting groups, are well known to those skilled in the art. The term "high energy protecting groups" denotes those protecting groups which require heat (typically at temperatures greater than about 70° C.) in order to begin the chemical amplification reaction. Suitable high activation energy protecting groups that can be employed in the present invention include: cyclic and branched (secondary and tertiary) aliphatic carbonyls, esters or ethers containing from about 3 to about 30 carbon groups.

Illustrative examples of cyclic or branched aliphatic carbonyls that may be employed in the present invention include, but are not limited to: phenolic carbonates; t-alkoxycarbonyloxys such as t-butoxylcarbonyloxy; and isopropyloxycarbonyloxy. A highly preferred carbonate that may be employed in the present invention is t-butoxylcarbonyloxy.

Some examples of cyclic and branched ethers that may be employed in the present invention include, but are not limited to: benzyl ether and t-alkyl ethers such t-butyl ether. Of the aforesaid ethers it is highly preferred to use t-butyl ether.

Examples of cyclic and branched esters that can be employed in the present invention are carboxylic esters having a cyclic or branched aliphatic substituent such as t-butyl ester, isobornyl ester , 2-methyl-2-admantyl ester, benzyl ester, 3-oxocyclohexanyl ester, dimethylpropylmethyl ester, mevalonic lactonyl ester, 3-hydroxy-γ-butyrolactonyl ester, 3-methyl-γ-butylrolactonyl ester, bis(trimethylsilyl)isopropyl ester, trimethylsilylethyl ester, tris(trimethylsilyl)silylethyl ester and cumyl ester.

The low activation energy protecting groups employed in the present invention are those groups which allow for the acid catalyzed deprotection reaction to occur readily at room temperature. Examples of low activation energy protecting groups that can be employed in the present invention include cyclic acetals or ketals and aliphatic silylethers.

Some examples of cyclic acetals and ketals that can be employed in the present invention include, but are not limited to: phenolic acetals and ketals as well as tetrahydrofuranyl, tetrahydropyranyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to: trimethysilylether, dimethylethylsilylether and dimethylpropylsilylether. Of these silylethers, it is preferred that trimethylsilylether be employed in the present invention.

As stated above, some, but not all, of the polar functional groups of the aqueous base soluble polymer resin are protected with at least two different acid labile protecting groups. When two protecting groups from the same class are employed, the aqueous base soluble polymer resin may preferably contain from about 3 to about 97 wt. % of said protecting groups. More preferably, the polymer resin may contain from about 10 to about 45 wt. % of said protecting groups.

In the embodiment where a high activation energy protecting group and a low activation energy protecting group are employed, the polymer resin is preferably protected with about 5 to about 95 mol % of a high activation energy protecting group. More preferably, in the embodiment wherein both classes of protecting groups are employed, the polymer resin is protected with from about 25 to about 75 mol % of a high activation energy protecting group.

The dual blocked polymer resins of the present invention are prepared by a two step process comprising of a one pot synthesis method and conventional synthesis methods for preparing acid sensitive polymers well known to those skilled in the art. Preferably, the high activation energy protecting groups are attached to the polar groups of the aqueous base soluble polymer first by conventional synthesis methods. This is followed by the protection of the polar groups with the low activation energy protecting groups with the one pot synthesis method which utilizes resist solvents as the polymerization solvent; therefore, eliminating the need of isolating the polymer from the solvents prior to resist formulation.

The dual blocked polymer resins of the present invention can be used in a chemically amplified positive-tone resist system which comprises, in addition to the dual blocked polymer, a photoacid generator, a solvent for the polymer resin, and, optionally a photosensitizer. The chemically amplified resist system of the present invention may further comprises a base and/or a surfactant.

The photoacid generators used in the resist formulation of the present invention are compounds which generate a strong acid upon exposure to energy. They are commonly employed herein as well as in the prior art for the deprotection of the acid liable protecting groups. Illustrative classes of such acid generators that can be employed in the present invention include, but are not limited to: nitrobenzyl compounds, onium salts, sulfonates, carboxylates and the like. A preferred acid generator employed in the present invention is an onium salt such as an iodonium salt or a sulfonium salt. Examples of photoacid generators are discussed in great length in Sinta, et al. supra, the contents of which are incorporated herein by reference.

The specific photoacid generator selected will depend on the irradiation source being used for patterning the resist. Photoacid generators are currently available for a variety of different wavelengths of light from the visible range to the X-ray range; thus, imaging of the resist can be performed using mid-UV, deep-UV, extreme-UV, e-beam, X-ray or any other irradiation source deemed useful.

The solvents that are employed as component (c) of the resist formulation of the present invention are well known solvents that are employed in the prior art to dissolve acid sensitive polymers. Illustrative examples of such solvents include, but are not limited to: ethers, glycol ethers, aromatic hydrocarbons, ketones, esters and the like may be employed in the present invention.

Suitable glycol ethers that can be employed in the present invention include: 2-methoxyethyl ether (diglyme), ethylene glycol monomethyl ether, propylene glycol monomethyl ether, propylene glycol monomethyl ether acetate (PGMEA) and the like. Examples of aromatic hydrocarbons that may be employed in the present invention include toluene, xylene and benzene; examples of ketones include methylisobutylketone, 2-heptanone, cycloheptanone and cyclohexanone; an example of an ether is tetrahydrofuran; whereas ethyl lactate and ethoxy ethyl proponate are examples of esters that can be employed in the present invention. Of the solvents mentioned hereinabove it is preferred that a glycol ether or an ester be employed, with PGMEA being the most preferred glycol ether and ethyl lactate being the most preferred ester.

The optional component of the present invention, i.e. the photosensitizer, is composed of chromophores that are capable of absorbing irradiation in the mid-UV, deep-UV, extreme-UV, X-ray or e-beam range. Illustrative examples of such chromophores include, but are not limited to: anthracene methanol, coumarins, 9,10-bis(trimethoxysilyl ethynyl)anthracene and polymers containing these chromophores. Of these compounds, it is preferred to use 9-anthracene methanol as the photosensitive compound for mid-UV irradiation.

The bases that can be employed in the present invention, as component (e), include, but are not limited to: berberine, cetyltrimethylammonium hydroxide, 1,8-bis(dimethylamino)naphthalene, tetrabutyl ammonium hydroxide (TBAH), amines, polymeric amines and the like. Of these bases, it is preferred that TBAH be employed in the present invention as the base component.

The surfactants that can be employed in the present invention are those that are capable of improving the coating homogeneity of the chemically amplified resist of the present invention. Illustrative examples of such surfactants include: fluorine-containing surfactants such as 3M's FC-430 and siloxane-containing surfactants such as Union Carbide's SILWET series and the like.

In accordance with the present invention, the chemically amplified resist system preferably comprises from about 1 to about 50 wt. % of component (a); from about 0.001 to about 14 wt. % of component (b); and from about 40 to about 99 wt. % of component (c). If a photosensitizer is present, it is preferably present in an amount of from about 0.001 to about 8 wt. %. When a base and/or surfactant are used, they are preferably present in amounts from about 0.01 to about 16 wt. % of said base (componente), and from about 100 to about 1000 ppm of said surfactant (component f). More preferably, the chemically amplified resist system of the present invention comprises from about 2 to about 30 wt. % of component (a); from about 0.005 to about 10 wt. % of component (b); from about 70 to about 95 wt. % of component (c); and, if present, from about 0.002 to about 2 wt. %. of a photosensitizer, from about 0.1 to about 6 wt. % of a base, and from about 150 to about 800 ppm of a surfactant.

The following examples are given to illustrate the scope and spirit of the present invention. Because these examples are given for illustrative purposes only, the invention embodied therein should not be limited thereto.

EXAMPLE 1

Synthesis of 1-methoxycyclohexene (MOCH)

500 mg of p-toluene sulfonic acid monohydrate was placed in a 2000 ml flask. Under house vacuum, the acid was heated with a heat gun to dry the glassware and to get rid of the hydrate from p-toluenesulfonic acid. About 750 ml of dimethoxycyclohexane (from TCI America) was added to the acid and the silicon oil bath under the 2000 ml flask was heated up to about 80°–90° C. The reaction was carried out overnight under house vacuum to pump off the generated methanol. On the second day, the oil bath was raised up to about 110° C. to distill the 1-methoxycyclohexene. The purity of the MOCH produced was about 95–100%.

EXAMPLE 2

Synthesis of Partially t-butoxycarbonyl (TBOC) and Methoxycyclohexanyl Dual Protected Polyhydroxystyrene (TBOC/MOCH=1/3)

An amount of 53.3 g solid of partially tert-butoxycarbonyl protected polyhydroxystyrene (~20 mole % protection on Hochest-Celanese polyhydroxystyrene) was deprotected at 50° C. under nitrogen for 3 days to give final protection of 5.5 mole %. 150 g of PGMEA was added to the solid and the mixture was stirred until a clear solution was obtained. The solution was then added in with approximately 30 mg of oxalic acid. After the acid was dissolved, 16.2 g of 1-methoxycyclohexene was added to the solution, and the reaction was carried out at room temperature with stirring overnight. The reaction was then quenched with 5 g of basic active aluminum oxide. The protection level of 22% on phenol group was determined by C13 NMR. This indicates an extra 16.5% protection was from MOCH group. The ratio of TBOC to MOCH was 1 to 3.

EXAMPLE 3
Synthesis of Partially t-butoxycarbonyl and Methoxycyclohexanyl Dual Protected Polyhydroxystyrene (TBOC/MOCH=2/1)

An amount of 50.2 g solid partially tert-butoxycarbonyl protected polyhydroxystyrene (~20 mole % protection on Hochest-Celanese polyhydroxystyrene) was deprotected at 50° C. under nitrogen overnight to give final protection of 13 mole %. 150 g of PGMEA was added to the solid and the mixture was stirred until a clear solution was obtained. The solution was then added in with approximately 30 mg of oxalic acid. After the acid was dissolved, 9 g of 1-methoxycyclohexene was added to the solution, and the reaction was carried out at room temperature with stirring overnight. The reaction was then quenched with 5 g of basic active aluminum oxide. The protection level of 19.5% on phenol group was determined by C13 NMR. This indicates an extra 6.5% protection was from MOCH group. The ratio of TBOC to MOCH is 2 to 1.

EXAMPLE 4
Synthesis of a Terpolymer by Partially Protecting Phenols of Hydroxystyrene-isobornylmethacrylate Copolymer With Methoxycyclohexanyl Group 25 g of hydroxy-styrene-isobornylmethacrylate copolymer (92/8 mole ratio) was added in 80 g of PGMEA and the mixture was stirred until a clear solution was obtained. The solution was then added in with approximately 30 mg of oxalic acid. After the acid was dissolved, 4.7 g of 1-methoxycyclohexene was added to the solution, and the reaction was carried out at room temperature with stirring overnight. The reaction was then quenched with 4 g of basic active aluminum oxide. The protection level of 15 mole % on phenol group was determined by C13 NMR.

EXAMPLE 5
Synthesis of a Terpolymer by Partially Protecting Phenols of Hydroxystyrene-t-butylacrylate Copolymer With Methoxycyclohexanyl Group 40 g of hydroxystyrene-isobornylmethacrylate copolymer (65/35 mole ratio) was added in 160 g of PGMEA and the mixture was stirred until a clear solution was obtained. The solution was then added in with approximately 30 mg of oxalic acid. After the acid was dissolved, 7.7 g of 1-methoxycyclohexene was added to the solution, and the reaction was carried out at room temperature with stirring overnight. The reaction was then quenched with 5 g of basic active aluminum oxide. The protection level of 18 mole % on phenol group was determined by C13 NMR.

EXAMPLE 6
Synthesis of Partially Tetrahydrofuranyl And Methoxycyclohexanyl Dual Protected Maruzen 10% Hydrogenated Polyhydroxystyrene (THF/MOCH=1/1) 125 g of 25 wt % Maruzen polymer solution in PGMEA was added in with approximately 60 mg of trifluoracetic acid. After the acid was dissolved, 3.7 g of dihydrofuran was added to the solution, and the reaction was carried out at room temperature with stirring overnight. The next day 6 g of 1-methoxycyclohexene was added into the solution and the mixture was stirred for one hour. It was then quenched with 5 g of basic active aluminum oxide. C13 NMR shows the polymer has 11 mole % of the phenol groups protected with THF and 11 mole % with MOCH. The ratio of THF to MOCH is 1 to 1.

EXAMPLE 7

A dual blocked terpolymer comprising of 80.5 mol % hydroxystyrene, 13 mol % t-butyloxycarbonyloxystyrene, and 6.5 mol % methoxycyclohexane protected hydroxystyrene (example 3) was dissolved in PGMEA with 4 wt % di(t-butylphenyl)iodium perfluorooctane sulfonate and 0.3 wt % t-butyl ammonium hydroxide to make a solution with 15 wt % solids content. The resulting solution was filtered through 0.1 $\mu$m filter. The resist was then spin coated on a 6 inch silicon wafer pre-coated with a 600 Angstrom thick bottom ARC (AR2). It was post-apply baked (PAB) at 100° C. for 60 seconds and exposed to DUV light (248 nm wavelength) on a GCA stepper (0.53 NA). The resist was post-exposure baked (PEB) at 100° C. for 90 seconds. 200 nm line and space features were resolved at a dose of 19.6 mJ/cm$^2$ with a single spray puddle development using 0.263N TMAH developer. The resist features showed an almost vertical wall profile and a square top. The depth of focus for 250 nm line and space features was 0.9 $\mu$m and dose latitude for 250 nm line and space feature was 23%.

EXAMPLE 8
(TBOC/MOCH=2/1) BM2

A dual blocked terpolymer comprising of 80.5 mol % hydroxystyrene, 13 mol % t-butyloxycarbonyloxystyrene, and 6.5 mol % methoxycyclohexane protected hydroxystyrene (example 3) was dissolved in PGMEA with 2 wt % triphenyl sulfonium triflate and 0.3 wt % t-butyl ammonium hydroxide to make a solution with 15 wt % solids content. The resulting solution was filtered through 0.1 $\mu$m filter. The resist was then spin coated on a 6 inch silicon wafer pre-coated with a 600 Angstrom thick bottom ARC (AR2). It was post-apply baked (PAB) at 100° C. for 60 seconds and exposed to DUV light (248 nm wavelength) on a GCA stepper (0.53 NA). The resist was post-exposure baked (PEB) at 100° C. for 90 seconds. 220 nm line and space features were resolved at a dose of 11 mJ/cm$^2$ with a single spray puddle development using 0.263N TMAH developer. The resist features showed sloping wall profile (about 85 degree) and a round top.

EXAMPLE 9
(TBOC/MOCH=1/3)

A dual blocked terpolymer comprising of 78 mol % hydroxystyrene, 5.5 mol % t-butyloxycarbonyloxystyrene, and 16.5 mol % methoxycyclohexane protected hydroxystyrene (example 2) was dissolved in PGMEA with 4 wt % di(tbutylphenyl) iodium perfluorooctane sulfonate and 0.3 wt % t-butyl ammonium hydroxide to make a solution with 15 wt % solids content. The resulting solution was filtered through 0.1 $\mu$m filter. The resist was then spin coated on a 6 inch silicon wafer pre-coated with a 600 Angstrom thick bottom ARC (AR2). It was post-apply baked (PAB) at 90° C. for 60 seconds and exposed to DUV light (248 nm wavelength) on a GCA stepper (0.53 NA). The resist was post-exposure baked (PEB) at 100° C. for 90 seconds. 200 nm line and space features were resolved at a dose of 11 mJ/cm$^2$ with a single spray puddle development using 0.263N TMAH developer. The resist features showed a sloping wall profile (about 85 degree) and a round top.

EXAMPLE 10
(TBOC/MOCH-1/3)

A dual blocker terpolymer comprising of 78 mol % hydroxystyrene, 5.5 mol % t-butyloxycarbonyloxystyrene, and 16.5 mol % methoxycyclohexne protected hydroxystyrene (example 2) was dissolved inPGMEA with 2 wt % triphenyl sulfonium triflate and 0.3 wt % t-butyl ammonium hydroxide to make a solution with 15 wt % solids content. The resulting solution was filtered through 0.1 $\mu$m filter. The resist was then spin coated on a 6 inch silicon wafer precoated with a 600 Angstrom thick bottom ARC (AR2). It was post-apply baked (PAB) at 100° C. for 60 seconds and exposed to DUV light (248 nm wavelength) on a GCA stepper (0.53 NA). The resist was post-exposure baked (PEB) at 100° C. for 90 seconds. 250 nm line and space features were resolved at a dose of 11 mJ/cm$^2$ with a single spray puddle development using 0.263N TMAH developer. The resist features showed a sloping wall profile (about 80 degree) and a round top and visible standing wave.

Comparative Example 1
Poly B Lithography

Polyhydroxystyrene protected with 22% tertiary butyl carbonate (t-BOC) was blended together in PGMEA with 4 wt % of di(t-butylphenyl) iodium perfluorocamphor sulfonate and 0.3 wt % tertiary butyl ammonium hydroxide to make a solution with 15 wt % of solid content. The resulting solution was filtered through a 0.1 $\mu$m filter. The resist was spin coated on a 6 inch silicon wafer which had a 900 Angstrom thick coating of IBM BARL (polyether bottom antirelective layer). The resist was post-apply baked (PAB) at 90° C. for 60 seconds and exposed to DUV light (248 wavelength) on a GCA stepper (0.53 NA). The wafer was then post-exposure baked (PEB) at 110° C. for 90 seconds. It was developed using a single spray puddle develop process for 45 seconds with Shipley's LDD26W 0.263 N TMAH developer.

Under these process conditions, the 210 nm nested lines on a 1:1 pitch were easily resolved. The 250 nm nested lines had approximately 28% exposure latitude. One limitation of this system was the post-exposure delay stability, which was less than 30 minutes.

Comparative Example 2
Poly E Lithography

A copolymer consisting of 65 mole % hydroxystyrene and 35 mole % tertiary butyl acrylate was blended in ethyl lactate with 4 wt % of di(t-butylphenyl) iodium perfluorooctane sulfonate and 0.3 wt % tertiary butyl ammonium hydroxide to make a solution with 15 wt % of solid content. The resulting solution was filtered through a 0.1 $\mu$m filter. The resist was spin coated on a 6 inch silicon wafer which had a 900 Angstrom thick coating of IBM BARL. The resist was post-apply baked (PAB) at 90° C. for 60 seconds and exposed to DUV light (248 nm wavelength) on a GCA stepper (0.53 NA). The wafer was then post-exposure baked (PEB) at 110° C. for 90 seconds. It was developed using a single-spray puddle develop process for 45 seconds with Shipley's LDD26W 0.263 N TMAH developer.

Under these process conditions, the 200 nm nested lines on a 1:1 pitch were resolved. The 250 nm nested lines had approximately 16% exposure latitude. The 250 nm isolated lines had a depth of focus of approximately 0.8 microns. The post-exposure delay stability showed unacceptable t-topping after 30 minutes.

While the invention has been particularly shown and described with respect to preferred embodiments thereof, it will be understood by those skilled in the art that the foregoing and other changes in form and detail may be made without departing from the spirit and scope of the invention.

Having thus described our invention, what we claim as new, and desire to secure by Letters Patent is:

1. A chemically amplified resist system comprising:
    (a) a dual blocked polymer resin, wherein said dual blocked polymer resin comprises an aqueous base soluble polymer resin having polar functional groups, wherein some, but not all, of said polar functional groups are blocked with a high activation energy acid labile protecting group and a low activation energy acid labile protecting group, wherein said high activation energy acid labile protecting group is a cyclic or branched aliphatic carbonyl containing from about 3 to about 30 carbon atoms and said low activation energy acid labile protecting group is a cyclic ketal;
    (b) an acid generator; and
    (c) a solvent for said polymer resin composition.

2. The chemically amplified resist system of claim 1 further comprising one or more of: (d) a photosensitizer that is capable of absorbing irradiation in the mid-UV, deep-UV, extreme-UV, X-ray or e-beam range; (e) a base; and (f) a surfactant.

3. The chemically amplified resist system of claim 1 wherein said aqueous base soluble polymer resin is a homopolymer or a polymer having two or more monomer units.

4. The chemically amplified resist system of claim 1 wherein said aqueous base soluble polymer resin contains hydroxyl or carboxyl functional groups.

5. The chemically amplified resist system of claim 3 wherein said aqueous base soluble polymer resin contains a polymeric backbone selected from the group consisting of polyolefins, polyolefin sulfones, polycyclic olefins, polycarbonates, polyimides, polyketones and polyethers.

6. The chemically amplified resist system of claim 5 wherein said polymeric backbone is polyethylene.

7. The chemically amplified resist system of claim 3 wherein said homopolymer is selected from the group consisting of phenolic-containing resins, polymers having an acid or anhydride group, and acrylamide, imide or hydroxyimide group type polymers.

8. The chemically amplified resist system of claim 7 wherein said homopolymer is a phenolic-containing resin.

9. The chemically amplified resist system of claim 8 wherein said phenolic-containing resin is poly (hydroxystyrene).

10. The chemically amplified resist system of claim 3 wherein said polymer containing at least two monomer units which are selected from the group consisting of hydroxystyrenes, styrenes, acrylates, vinylcyclohexanol, phenol formaldehydes, methacrylates, acrylamides, maleic anhydrides, acrylic acid, methacrylic acid and maleimides.

11. The chemically amplified resist system of claim 1 wherein said high activation energy protecting group is a branched aliphatic carbonyl selected from the group consisting of phenolic carbonates, t-butoxylcarbonyloxy and isopropyloxycarbonyloxy.

12. The chemically amplified resist system of claim 1 wherein said ketal is a phenolic ketal or methoxycyclohexanyl ketal.

13. The chemically amplified resist system of claim 1 wherein said aqueous base soluble polymer resin is partially protected with from about 3 to about 97 wt. % of said acid labile protecting groups.

14. The chemically amplified resist of claim 13 wherein said aqueous base soluble polymer resin is partially protected with from about 10 to about 45 wt. % of said acid labile protecting groups.

15. The chemically amplified resist system of claim 1 wherein said aqueous base soluble polymer resin is partially protected with from about 5 to about 95 mol % of a said high activation energy protecting group.

16. The chemically amplified resist system of claim 15 wherein said aqueous base soluble polymer resin is partially protected with from about 25 to about 75 mol % of a said high activation energy protecting group.

17. The chemically amplified resist system of claim 2 wherein said resist system comprises from about 1 to about 50 wt % of component (a); from about 0.001 to about 14 wt % of component (b); from about 40 to about 99 wt % of component (c); and when present from about 0.001 to about 8 wt % of component (d), from about 0.01 to about 16 wt % of component (e), and from about 100 to about 1000 ppm of component (f).

18. The chemically amplified resist system of claim 17, wherein said resist system comprises from about 2 to about 30 wt % of component (a); from about 0.005 to about 10 wt % of component (b); from about 70 to about 95 wt % of component (c); and when present from about 0.002 to about 2 wt % of component (d), from about 0.1 to about 6 wt % of component (e), and from about 150 to about 800 ppm of component (f).

19. The chemically amplified resist system of claim 1 wherein said photoacid generator is selected from the group consisting of nitrobenzyl compounds, onium salts, sulfonates and carboxylates.

20. The chemically amplified resist system of claim 1 wherein said solvent is selected from the group consisting of ethers, glycol ethers, aromatic hydrocarbons, lactones and esters.

21. The chemically amplified resist system of claim 2 wherein said photosensitizer is selected from the group consisting of anthracene methanol, coumarins and 9,10-bis (trimethoxysilyl ethynyl)anthracene.

22. The chemically amplified resist system of claim 2 wherein said base is selected from the group consisting of berberine, cetyltrimethylammonium hydroxide, 1,8-bis (dimethylamine)-naphthalene, tetrabutyl ammonium hydroxide, amines and polymeric amines.

23. The chemically amplified resist system of claim 2 wherein said surfactant is a fluorine-containing surfactant or a siloxane-containing surfactant.

24. A resist for use in semiconductor manufacturing comprising a dual blocked polymer resin, wherein said dual blocked polymer resin comprises a polymer resin having polar functional groups, wherein some, but not all, of said polar functional groups are blocked with at a high activation energy acid labile protecting group and a low activation energy acid labile protecting group, wherein said high activation energy acid labile protecting group is a cyclic or branched aliphatic carbonyl containing from about 3 to about 30 carbon atoms and said low activation energy acid labile protecting group is a cyclic ketal.

* * * * *

UNITED STATES PATENT AND TRADEMARK OFFICE
CERTIFICATE OF CORRECTION

| | |
|---|---|
| PATENT NO. | : 6,303,263 B1 |
| APPLICATION NO. | : 09/030568 |
| DATED | : October 16, 2001 |
| INVENTOR(S) | : K. Chen et al. |

It is certified that error appears in the above-identified patent and that said Letters Patent is hereby corrected as shown below:

Column 6,
Lines 63-64, "Synthesis of Partially t-butoxycarbonyl (TBOC) and Methoxycyclohexanyl Dual Protected Polyhydroxystyrene" should read --Synthesis of partially t-butoxycarbonyl (TBOC) and methoxycyclohexanyl dual protected polyhydroxystyrene--

Column 7,
Lines 16-18, "Synthesis of Partially t-butoxycarbonyl (TBOC) and Methoxycyclohexanyl Dual Protected Polyhydroxystyrene" should read --Synthesis of partially t-butoxycarbonyl (TBOC) and methoxycyclohexanyl dual protected polyhydroxystyrene--

Column 7,
Lines 35-37, "Synthesis of Partially t-butoxycarbonyl (TBOC) and Methoxycyclohexanyl Dual Protected Polyhydroxystyrene" should read --Synthesis of partially t-butoxycarbonyl (TBOC) and methoxycyclohexanyl dual protected polyhydroxystyrene--

Column 7,
Line 37, "Group 25 g" should read --group.-- "25 g" should begin new paragraph.

Column 7,
Lines 50-52, "Synthesis of Partially t-butoxycarbonyl (TBOC) and Methoxycyclohexanyl Dual Protected Polyhydroxystyrene" should read --Synthesis of partially t-butoxycarbonyl (TBOC) and methoxycyclohexanyl dual protected polyhydroxystyrene--

Column 7,
Line 52, "Group 40 g." should read --group.-- "40 g" should begin new paragraph.

Column 7,
Lines 65-67, "Synthesis of Partially t-butoxycarbonyl (TBOC) and Methoxycyclohexanyl Dual Protected Polyhydroxystyrene" should read --Synthesis of partially t-butoxycarbonyl (TBOC) and methoxycyclohexanyl dual protected polyhydroxystyrene--

Column 7,
Line 67, "(THF/MOCH=1/1) 125 g" should read --(THF/MOCH=1/1).-- "125 g" should begin new paragraph.

UNITED STATES PATENT AND TRADEMARK OFFICE
CERTIFICATE OF CORRECTION

PATENT NO.       : 6,303,263 B1
APPLICATION NO. : 09/030568
DATED            : October 16, 2001
INVENTOR(S)      : K. Chen et al.

It is certified that error appears in the above-identified patent and that said Letters Patent is hereby corrected as shown below:

Column 11, Claim 15,
Line 11, "of a said" should read --of said--

Column 11, Claim 16,
Line 15, "of a said" should read --of said--

Signed and Sealed this

Thirty-first Day of July, 2007

JON W. DUDAS
*Director of the United States Patent and Trademark Office*